(12) United States Patent
Jiang et al.

(10) Patent No.: US 12,415,718 B2
(45) Date of Patent: Sep. 16, 2025

(54) IMPACT-RESISTANT MICROMECHANICAL ARMS

(71) Applicant: Taiwan Semiconductor Manufacturing Company, Ltd., Hsinchu (TW)

(72) Inventors: Jheng-Hong Jiang, Hsinchu (TW); Shing-Huang Wu, Hsinchu (TW); Chia-Wei Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 535 days.

(21) Appl. No.: 17/671,604

(22) Filed: Feb. 15, 2022

(65) Prior Publication Data
US 2022/0411259 A1  Dec. 29, 2022

Related U.S. Application Data

(60) Provisional application No. 63/215,331, filed on Jun. 25, 2021.

(51) Int. Cl.
*B81B 7/00* (2006.01)

(52) U.S. Cl.
CPC ........ *B81B 7/0009* (2013.01); *B81B 2203/01* (2013.01); *B81B 2203/0315* (2013.01); *B81B 2207/99* (2013.01)

(58) Field of Classification Search
CPC .............. B81B 2203/01; B81B 7/0009; B81B 2203/0315; B81B 2207/99; B81B 7/0016; B81B 2203/0118
See application file for complete search history.

(56) References Cited

U.S. PATENT DOCUMENTS

| | | | | |
|---|---|---|---|---|
| 6,803,640 | B1* | 10/2004 | Lee | H01L 29/945 |
| | | | | 257/532 |
| 8,362,675 | B2* | 1/2013 | Chen | H03H 9/02834 |
| | | | | 310/346 |
| 2004/0104444 | A1* | 6/2004 | Wachtmann | G01P 15/0802 |
| | | | | 257/414 |
| 2005/0139542 | A1* | 6/2005 | Dickensheets | B81B 3/007 |
| | | | | 210/490 |
| 2006/0076559 | A1* | 4/2006 | Faure | C30B 33/00 |
| | | | | 257/617 |
| 2013/0043548 | A1* | 2/2013 | Reinmuth | B81C 1/00626 |
| | | | | 257/417 |
| 2014/0053651 | A1* | 2/2014 | Besling | G01L 9/0042 |
| | | | | 73/702 |
| 2016/0145094 | A1* | 5/2016 | Lee | B81B 7/0058 |
| | | | | 257/774 |
| 2016/0304341 | A1* | 10/2016 | Bright | C23C 16/45525 |
| 2019/0375629 | A1* | 12/2019 | Duqi | B81C 1/00523 |
| 2023/0047856 | A1* | 2/2023 | Deh | H04R 31/003 |

* cited by examiner

*Primary Examiner* — William B Partridge
*Assistant Examiner* — David Paul Sedorook
(74) *Attorney, Agent, or Firm* — KILPATRICK TOWNSEND & STOCKTON LLP (57) ABSTRACT

A micromechanical arm is provided. The micromechanical arm includes: a bottom metal piece having a plurality of trenches extending downwardly from a top surface of the bottom metal piece; an intermediate layer on the bottom metal piece and filling at least a portion of each of the plurality of trenches; and a top metal piece on the intermediate layer. The intermediate layer is made of a material that has a stiffness smaller than the bottom metal piece and the top metal piece.

20 Claims, 11 Drawing Sheets

IMPACT-RESISTANT MICROMECHANICAL ARMS

CROSS-REFERENCES TO RELATED APPLICATIONS

The present application claims priority to U.S. Provisional Patent Application No. 63/215,331, filed on Jun. 25, 2021, the entire disclosure of which is incorporated herein by reference.

FIELD

Embodiments of the present disclosure relate generally to micro-electromechanical systems (MEMS) or nano-electromechnical systems (NEMS) devices, and more particularly to mechanical arms used in MEMS/NEMS devices.

BACKGROUND

Micro-electromechanical systems ("MEMS") are becoming increasingly popular, particularly as such devices are miniaturized and are integrated into integrated circuit manufacturing processes. MEMS are typically made up of components between 1 and 100 micrometers in size, and MEMS devices generally range in size from 20 micrometers to a millimeter. MEMS merge at the nanoscale into nano-electromechanical systems (NEMS) and nanotechnology.

MEMS devices include mechanical and electrical features formed by one or more semiconductor manufacturing processes. Examples of MEMS devices include micro-sensors, which convert mechanical signals into electrical signals; micro-actuators, which convert electrical signals into mechanical signals; and motion sensors, which are commonly found in automobiles (e.g., in airbag deployment systems) and smartphones. For many applications, MEMS devices are electrically connected to application-specific integrated circuits (ASICs), and to external circuitry to form complete MEMS systems. However, if a MEMS device breaks, for example, due to some impact when being used, it is difficult, if not infeasible, to repair or replace the broken MEMS device. Therefore, there is a need to fabricate reliable, robust, and impact-resistant MEMS devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Micromechanical arms (also referred to as "micromechanical beams") are typically elongated structures fabricated using semiconductor processes. Micromechanical arms are widely-used components in various MEMS/NEMS devices. For example, micromechanical arms are used in accelerometers, which can measure the force of acceleration, whether caused by gravity or by movement. The movement and tilt of the electronic device (e.g., a smartphone, a wearable device, etc.) that has the accelerometers, therefore, can be sensed. In some situations, a micromechanical arm has a fixed end (often referred to as a "support") and a free end, and the displacement of the free end can be calculated by measuring a capacitance between the micromechanical arm and a sensing electrode. The displacement of the free end can be used to calculate other parameters such as velocities and accelerations. In other situations, a micromechanical arm may have two fixed ends. It should be understood that even if the term "MEMS device" is used below, the disclosure is generally applicable to MEMS/NEMS devices.

However, the impact on the MEMS device can render the micromechanical arms inside the MEMS device broken. For instance, a smartphone accidentally falls on the ground, and the impact could result in a fractured touchscreen and broken micromechanical arms in various MEMS devices inside the smartphone. While it is feasible to replace the touchscreen, it is impractical, if not impossible, to replace the broken micromechanical arms, given that the critical dimensions of the broken micromechanical arms are at the microscale or even the nanoscale. As a result, the functioning of the smartphone may be significantly compromised. Thus, the robustness and impact resistance of micromechanical arms are desirable.

In accordance with some aspects of the disclosure, micromechanical arms, MEMS structures including micromechanical arms, and corresponding fabrication methods are provided. In some embodiments, a micromechanical arm of a MEMS structure includes a bottom metal piece, a top metal piece, and an intermediate layer sandwiched between them. The stiffness of the material of the intermediate layer is smaller than those of the bottom metal piece and the top metal piece. As such, the micromechanical arm has a sandwich structure with a relatively softer intermediate layer between the relatively harder bottom metal piece and top metal piece. As a result, the micromechanical arm is impact-resistant and harder to be broken. On the other hand, the top surface of the bottom metal piece has multiple trenches, and the intermediate layer fills at least a portion of each of the multiple trenches. As a result, the surface area of the intermediate layer becomes larger than the top surface without the trenches. The increased surface area provides a better stress release buffer. In some implementations, the intermediate layer can include multiple layers stacked together. In some implementations, the intermediate layer can be enclosed in the multiple trenches by the bottom metal piece and the top metal piece, by adding a planarization process to the fabrication method. Details of the disclosure will be described below with reference to FIGS. 1-7D.

Figure 1:
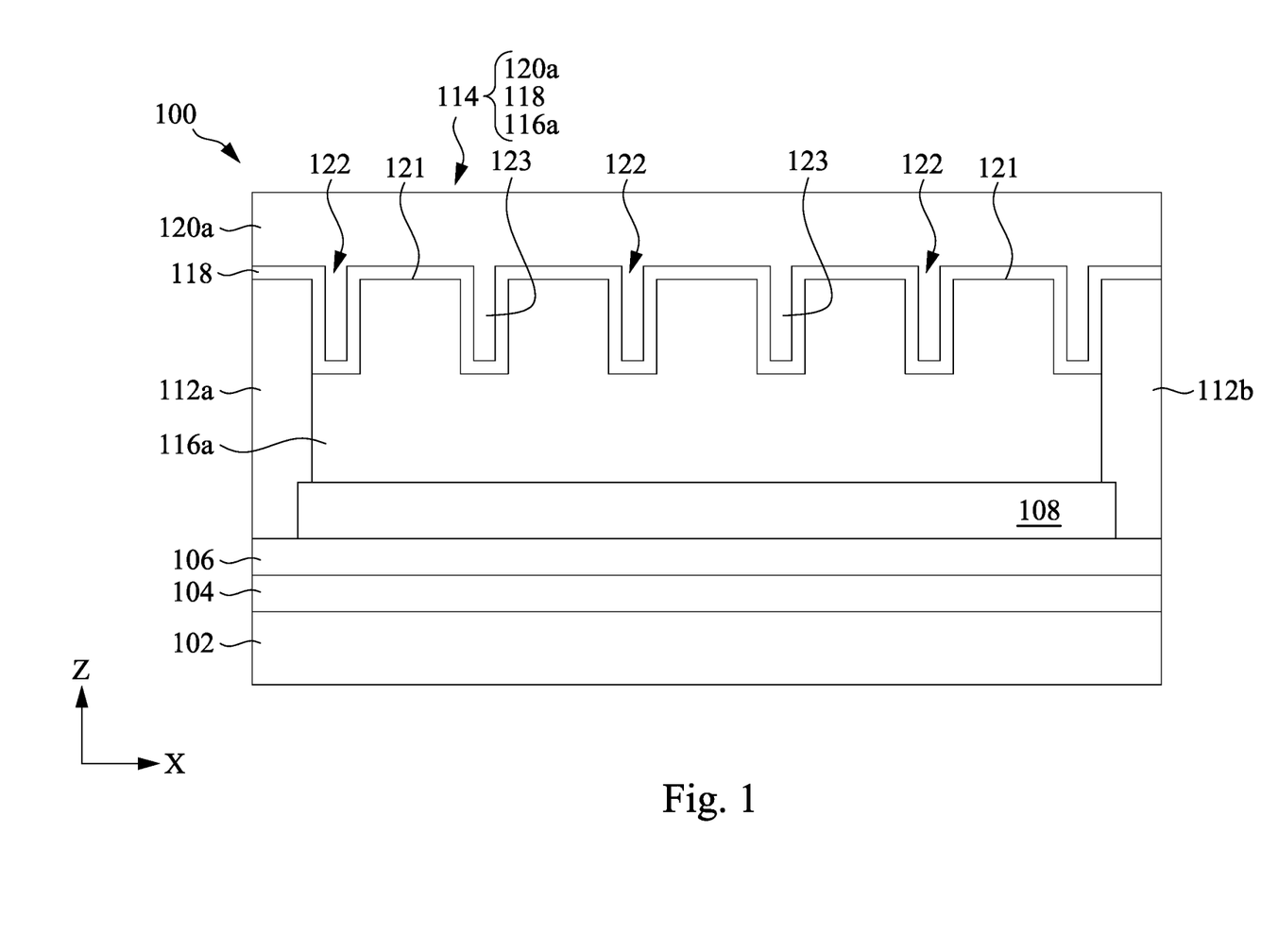
FIG. 1 is a cross-sectional diagram illustrating a MEMS structure having a mechanical arm in accordance with some embodiments.

FIG. 1 is a cross-sectional diagram illustrating a MEMS structure 100 having a mechanical arm 114 in accordance with some embodiments. In the example shown in FIG. 1, the MEMS structure 100 includes, among other things, a substrate 102, a dielectric layer 104 on the substrate 102, an etch stop layer 106 on the dielectric layer 104, two dielectric support structures 112a and 112b, a micromechanical arm 114. The micromechanical arm 114 is located between and in contact with the dielectric support structures 112a and 112b in a first horizontal direction (i.e., the X-direction shown in FIG. 1) in which the micromechanical arm 114 extends. The dielectric support structures 112a and 112b are on the etch stop layer 106 and extend in the Z-direction. Each of the dielectric support structures 112a and 112b is in contact with an end of the micromechanical arm 114 in the X-direction. It should be understood that although two dielectric support structures 112a and 112b are illustrated in the example shown in FIG. 1, this is not intended to be limiting. In other embodiments, one dielectric support structure is located at one end of the micromechanical arm 114, and the other end of the micromechanical arm 114 is a free end.

The micromechanical arm 114 is located over the etch stop layer 106, and a cavity 108 is located between the etch stop layer 106 and the micromechanical arm 114 in a vertical direction (i.e., the Z-direction as shown in FIG. 1). In one implementation, the cavity 108 is fabricated using a sacrificial release process. In the sacrificial release process, a sacrificial layer is formed on the etch stop layer 106 and later removed to create the cavity 108 between the etch stop layer 106 and the micromechanical arm 114. The sacrificial release process will be described in detail below. The cavity 108 renders the mechanical arm 114 suspended from the substrate 102, the dielectric layer 104, and the etch stop layer 106 and enables the movement of the mechanical arm 114. The displacement of the mechanical arm 114 can, therefore, be used for calculating various parameters such as accelerations by the MEMS device that includes the MEMS structure 100.

In the example shown in FIG. 1, the micromechanical arm 114 includes a bottom metal piece 116a, a top metal piece 120a over the bottom metal piece 116a in the Z-direction, and an intermediate layer 118 sandwiched between the bottom metal piece 116a and the top metal piece 120a. The bottom metal piece 116a has a top surface 121 and multiple trenches 122 located at the top surface 121. The trenches 122 extend downwardly from the top surface 121 in the Z-direction shown in FIG. 1. The intermediate layer 118 is formed on the bottom metal piece 116a. In the example shown in FIG. 1, the intermediate layer 118 covers the top surface 121 of the bottom metal piece 116a and fills at least the bottoms and sidewalls of the trenches 122. In other words, the profile of the intermediate layer 118 in the X-Z plane is not flat. As a result, the surface area of the intermediate layer 118 becomes larger than the top surface 121 without the trenches 122. In the example shown in FIG. 1, the top metal piece 120a has protrusions that are located in the trenches 122, respectively, and extend downwardly in the Z-direction. In other words, the intermediate layer 118 and the protrusions 123 together fill the trenches 122.

The intermediate layer 118 is made of a material that is softer than the bottom metal piece 116a and the top metal piece 120a. The stiffness of the material of the intermediate layer 118 is smaller than those of the bottom metal piece 116a and the top metal piece 120a. Stiffness is the extent to which an object resists deformation in response to an applied force.

The bottom metal piece 116a and the top metal piece 120a may be made any suitable metals or alloys. In one example, the bottom metal piece 116a and the top metal piece 120a are both made of titanium (Ti). In another example, the bottom metal piece 116a and the top metal piece 120a are both made of tantalum (Ta). In yet another example, the bottom metal piece 116a and the top metal piece 120a are both made of aluminum (Al). In one example, the bottom metal piece 116a and the top metal piece 120a are both made of copper (Cu). In another example, the bottom metal piece 116a and the top metal piece 120a are both made of tungsten (W). In yet another example, the bottom metal piece 116a and the top metal piece 120a are both made of aluminum-copper alloy (AlCu). It should be understood that these examples are not intended to be limiting. It should be understood that the bottom metal piece 116a and the top metal piece 120a, in some embodiments, may be made of different materials.

The intermediate layer 118 may be made of materials such as single crystal silicon, amorphous silicon, polycrystalline silicon (also referred to as "polysilicon"), silicon nitride ($Si_3N_4$), silicon oxynitride ($SiO_xN_y$), various low-κ dielectrics (as compared to silicon dioxide), various extreme low-κ dielectrics (as compared to silicon dioxide), and the like. It should be understood that these examples are not intended to be limiting, and the intermediate layer 118 can be made of any material having a stiffness smaller than those of the bottom metal piece 116a and the top metal piece 120a.

In some embodiments, the dielectric layer 104 may relieve stress between the substrate 102 and the etch stop layer 106, diminishing stress-induced dislocations in the substrate 102. In some embodiments, the etch stop layer 106 is sufficiently thick to protect the dielectric layer 104 and the substrate 102 from the etchant used during the sacrificial release process.

In one example, the substrate 102 is made of silicon, the dielectric layer 104 is made of silicon dioxide (sometimes referred to as a "pad oxide"), and the etch stop layer 106 is made of silicon nitride (sometimes referred to as a "pad nitride"). It should be noted that this is not intended to be limiting. Other suitable combinations of the materials of the substrate 102, the dielectric layer 104, and the etch stop layer 106 are within the scope of the disclosure.

As explained above, the stiffness of the material of the intermediate layer 118 is smaller than those of the bottom metal piece 116a and the top metal piece 120a. Therefore, the micromechanical arm has a sandwich structure with a relatively softer intermediate layer 118 between the relatively harder bottom metal piece 116a and top metal piece 120a. As a result, the micromechanical arm 114 of the MEMS structure 100 is impact-resistant and harder to be broken. On the other hand, the surface area of the intermediate layer 118 becomes larger than the top surface 121 without the trenches 122, as explained above. The increased surface area provides a better stress release buffer. It should be understood that the advantages of improved impact resistance and better stress release buffer are independent of the types of MEMS devices that have the micromechanical arm 114.

It should be understood that the MEMS structure 100, in some examples, is a part of a functional MEMS device that includes other components such as electrodes, application-specific integrated circuits (ASICs), and external circuitry. In some examples, multiple MEMS structures like the MEMS structure 100 shown in FIG. 1 can be employed in combination. For instance, multiple MEMS structures can be organized in different orientations, thus making it possible to detect acceleration components in different directions. The MEMS structure 100 shown in FIG. 1 is a building block of various MEMS devices. Thus, the disclosure can be applied to various MEMS devices.

Figure 2:
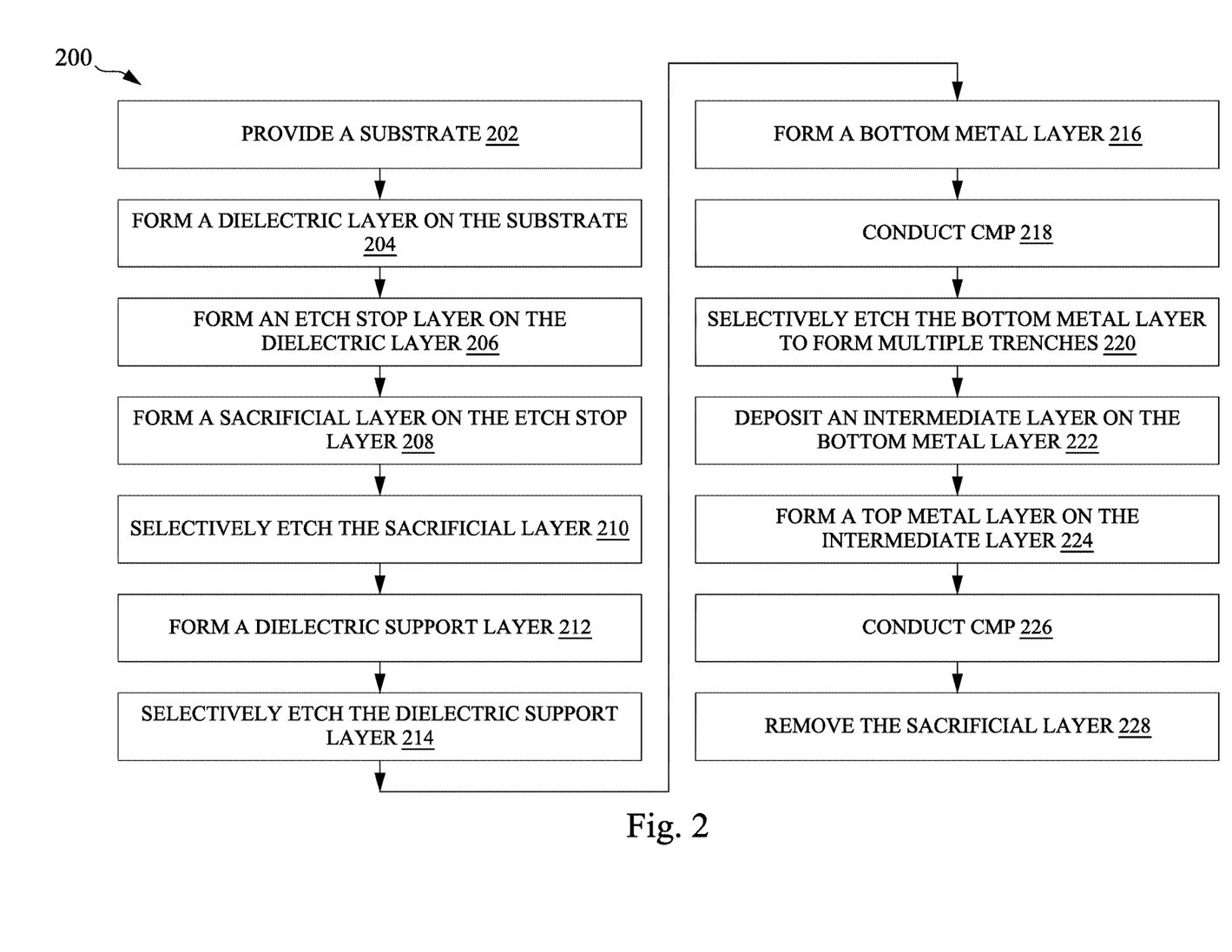
FIG. 2 is a flowchart diagram illustrating a method for fabricating the MEMS structure shown in FIG. 1 in accordance with some embodiments.

FIG. 2 is a flowchart diagram illustrating a method for fabricating the MEMS structure 100 shown in FIG. 1 in accordance with some embodiments. It should be noted that the operations of the method 200 may be rearranged or otherwise modified within the scope of the various aspects. It is further noted that additional processes may be provided before, during, and after the method 200 of FIG. 2, and that some other processes may only be briefly described herein. Thus, other implementations are possible within the scope of the various aspects described herein. FIGS. 3A-3E are cross-sectional views of the MEMS structure 100 shown in FIG. 1 at various stages of fabrication in accordance with some embodiments.

The method 200 starts at operation 202. At operation 202, a substrate is provided. In one implementation, the substrate is made of silicon. In other implementations, the substrate may include silicon germanium (SiGe), gallium arsenic (GaAs), or other suitable semiconductor materials. Furthermore, the substrate may be a layered silicon-insulator-silicon substrate using the silicon on insulator (SOI) technologies. It should be understood that these implementations are not intended to be limiting.

At operation 204, a dielectric layer is formed on the substrate. As explained above, the dielectric layer may relieve stress between the substrate and the etch stop layer to be formed on the dielectric layer, diminishing stress-induced dislocations in the substrate. In one implementation, the dielectric layer is made of silicon dioxide ($SiO_2$). In one example, the silicon dioxide dielectric layer is formed by thermal oxidation. In another example, the silicon dioxide dielectric layer is formed by deposition techniques such as chemical vapor deposition (CVD) or physical vapor deposition (PVD). In other implementations, the dielectric layer may include silicon nitride ($Si_3N_4$) or other suitable dielectric materials.

At operation 206, an etch stop layer is formed on the dielectric layer. As explained above, the etch stop layer, in some implementations, is sufficiently thick to protect the dielectric layer and the substrate from the etchant that is used during the sacrificial release process. In one implementation, the etch stop layer is made of silicon nitride ($Si_3N_4$). In other implementations, the etch stop layer may include silicon oxynitride ($SiO_xN_y$), silicon carbide (SiC), silicon oxycarbide, silicon carbon nitride, other dielectrics, combinations thereof, or the like. The etch stop layer may be formed by various deposition techniques such as plasma enhanced chemical vapor deposition (PECVD), low pressure CVD (LPCVD), or physical vapor deposition (PVD), or the like. It should be understood that the examples above are not intended to be limiting.

At operation 208, a sacrificial layer is formed on the etch stop layer. The sacrificial layer is made of a material that is selectively removable in the subsequent sacrificial release process. The sacrificial layer will be used in the subsequent sacrificial release process to create the cavity 108 shown in FIG. 1. The sacrificial layer may be formed by techniques such as CVD, LPCVD, PCD, plating, or the like.

Figure 3A:
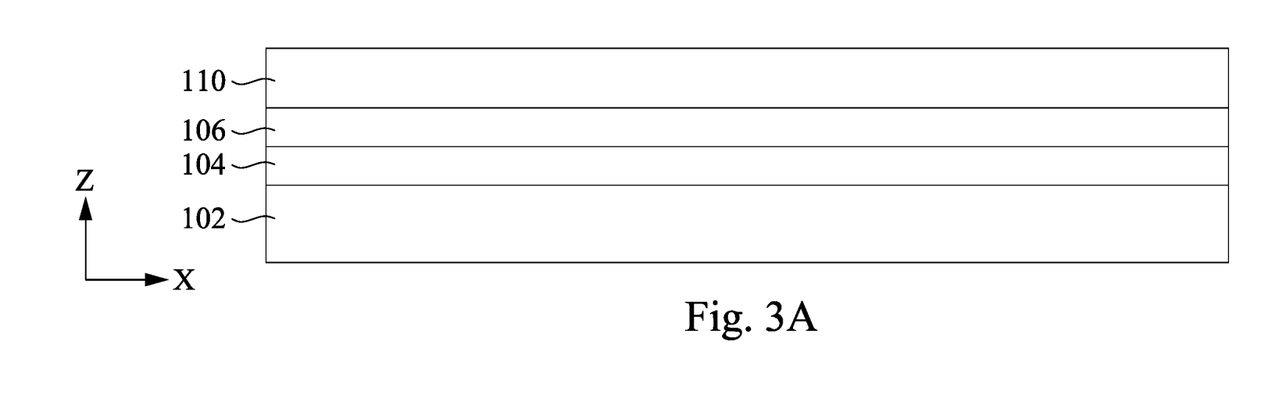
FIGS. 3A-3E are cross-sectional views of the MEMS structure shown in FIG. 1 at various stages of fabrication in accordance with some embodiments.

In the example shown in FIG. 3A, after operation 208, the sacrificial layer 110 is on the etch stop layer 106, which is on the dielectric layer 104, which is on the substrate 102. In one implementation, the substrate 102 is made of silicon, the dielectric layer 104 is made of silicon dioxide, the etch stop layer 106 is made of silicon nitride, and the sacrificial layer 110 is made of polysilicon. It should be noted that this is not intended to be limiting, and other suitable combinations of materials of the substrate 102, the dielectric layer 104, the etch stop layer 106, and the sacrificial layer 110 are within the scope of the disclosure.

At operation 210, the sacrificial layer is selectively etched. After operation 210, the remaining sacrificial layer corresponds to the area where the micromechanical arm is situated. As such, the micromechanical arm will be suspended after the sacrificial release process, during which the remaining sacrificial layer is removed. In some implementations, the sacrificial layer is selectively etched by etching areas of the sacrificial layer that are left exposed by a photoresist mask. In some implementations, the sacrificial layer is selectively etched by wet etching. In other implementations, the sacrificial layer is selectively etched by dry etching. It should be noted that the examples above are not intended to be limiting.

In the example shown in FIG. 3B, after operation 210, the sacrificial layer 110 shown in FIG. 3A is selectively etched, and the remaining sacrificial layer 110a corresponds to the area where the micromechanical arm will later be situated.

At operation 212, a dielectric support layer is formed. The dielectric support layer is on the etch stop layer or the remaining sacrificial layer. In one implementation, the dielectric support layer is made of silicon dioxide ($SiO_2$). In one example, the silicon dioxide dielectric support layer is formed by CVD or PVD. In other implementations, the dielectric layer may include other suitable dielectric materials. In the example shown in FIG. 3B, after operation 212, the dielectric support layer 112 covers the etch stop layer 106 and the remaining sacrificial layer 110a.

The method 200 then proceeds to operation 214. At operation 214, the dielectric support layer is selectively etched. After operation 214, an opening is formed in the dielectric support layer. The opening is used to accommodate the bottom metal piece, as will be explained below. In some implementations, the dielectric support layer is selectively etched by etching areas of the dielectric support layer that are left exposed by a photoresist mask. In some implementations, the dielectric support layer is selectively etched by wet etching. In other implementations, the dielectric support layer is selectively etched by dry etching. It should be noted that the examples above are not intended to be limiting.

Figure 3B:
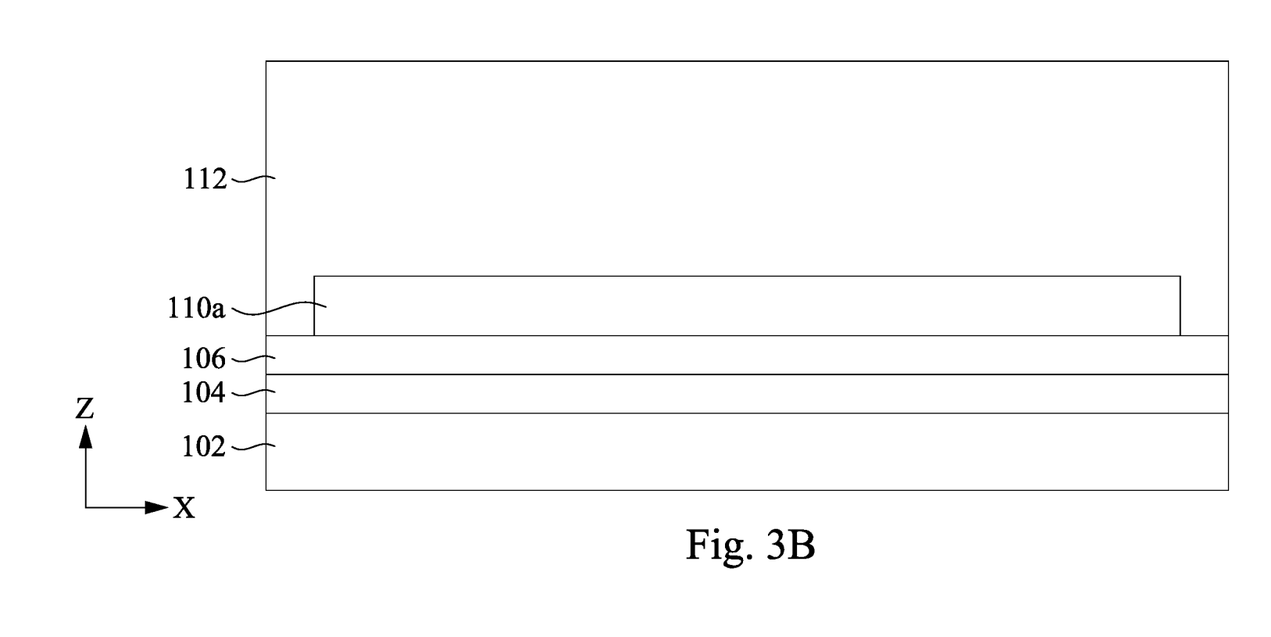
Figure 3C:
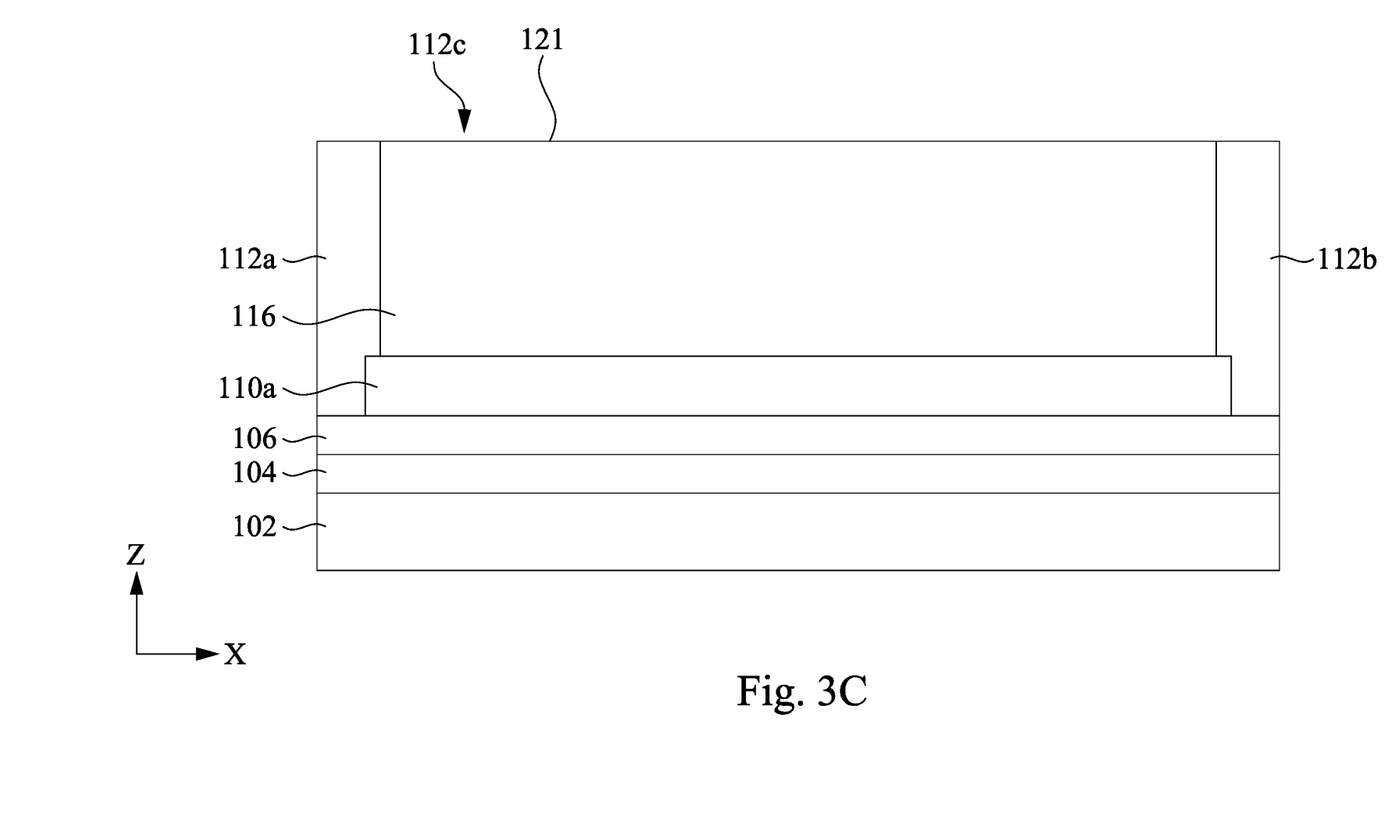

In the example shown in FIG. 3C, after operation 214, the dielectric support layer 112 shown in FIG. 3B is selectively etched. An opening 112c is created between the dielectric support structures 112a and 112b in the X-direction.

At operation 216, a bottom metal layer is formed. The bottom metal layer fills the opening in the dielectric support layer. In some implementations, the bottom metal layer is formed using metal plating techniques such as electroplating (sometimes referred to as electroplating deposition (ECD)). The bottom metal layer may be made of materials such as titanium (Ti), tantalum (Ta), aluminum (Al), copper (Cu), tungsten (W), aluminum-copper alloy (AlCu), or other suitable materials. It should be understood that these examples are not intended to be limiting.

At operation 218, a planarization process is conducted. The planarization process is conducted to remove excess metal outside the opening. In one implementation, the planarization process is a chemical-mechanical polishing (CMP) process.

In the example shown in FIG. 3C, after operation 218, the bottom metal layer 116 fills the opening 112c in the dielectric support layer 112. Because of the planarization process conducted at operation 218, the excessive bottom metal layer 116 outside the opening 112c has been removed. The bottom metal layer 116 has a top surface 121. The bottom metal layer 116 is located between the dielectric support structures 112a and 112b in the X-direction.

The method 200 then proceeds to operation 220. At operation 220, the bottom metal layer is selectively etched to form multiple trenches. In some implementations, the bottom metal layer is selectively etched using dry etching such as plasma etching, reactive-ion etching (RIE), sputter etching, magnetically enhanced RIE (MERIE), reactive-ion-beam etching, and high-density plasma (HDP) etching.

Figure 3D:
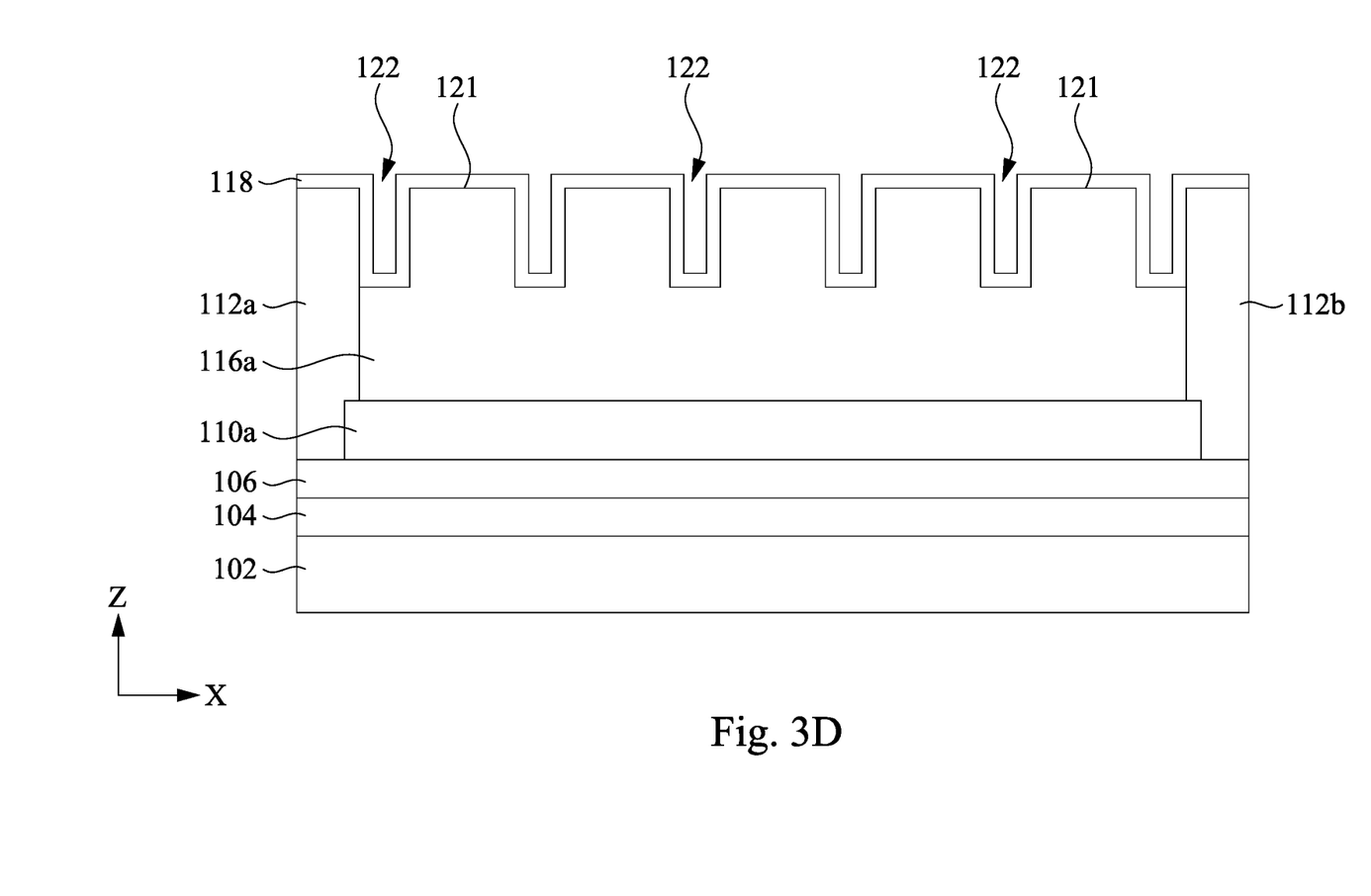

In the example shown in FIG. 3D, after operation 220, multiple trenches 122 are created. Each of those trenches 122 extends downwardly from the top surface 121 in the Z-direction.

The method 200 then proceeds to operation 222. At operation 222, an intermediate layer is deposited on the bottom metal layer. In some implementations, the intermediate layer is formed by deposition techniques such as CVD or PVD. As explained above, the intermediate layer is made of a material that is softer than the bottom metal layer. In one example, the intermediate layer is made of polysilicon. In another example, the intermediate layer is made of silicon nitride ($Si_3N_4$). In yet another example, the intermediate layer is made of a low-κ dielectric (as compared to silicon dioxide). In another example, the intermediate layer is made of an extreme low-κ dielectric (as compared to silicon dioxide). It should be understood that these examples are not intended to be limiting, and the intermediate layer can be made of a material having a stiffness smaller than that of the bottom metal layer.

In the example shown in FIG. 3D, after operation 222, the intermediate layer 118 is formed on the bottom metal piece 116a. The intermediate layer 118 covers the top surface 121 of the bottom metal piece 116a and fills at least the bottoms and sidewalls of the trenches 122. As such, the surface area of the intermediate layer 118 becomes larger than the top surface 121 without the trenches 122.

The method 200 then proceeds to operation 224. At operation 224, a top metal layer is deposited on the intermediate layer. In one example, the top metal layer fills the unfilled portion of the trenches. As a result, the resultant top metal piece has protrusions that are located in the trenches and extend downwardly in the Z-direction. In some implementations, the top metal layer is formed using metal plating techniques such as electroplating. The top metal layer may be made of materials such as titanium (Ti), tantalum (Ta), aluminum (Al), copper (Cu), tungsten (W), aluminum-copper alloy (AlCu), or other suitable materials. It should be understood that these examples are not intended to be limiting.

The method 200 then proceeds to operation 226. At operation 226, a planarization process is conducted. The planarization process is conducted to flatten the top surface of the top metal layer and thin the top metal layer if necessary. In one implementation, the planarization process is a chemical-mechanical polishing (CMP) process.

Figure 3E:
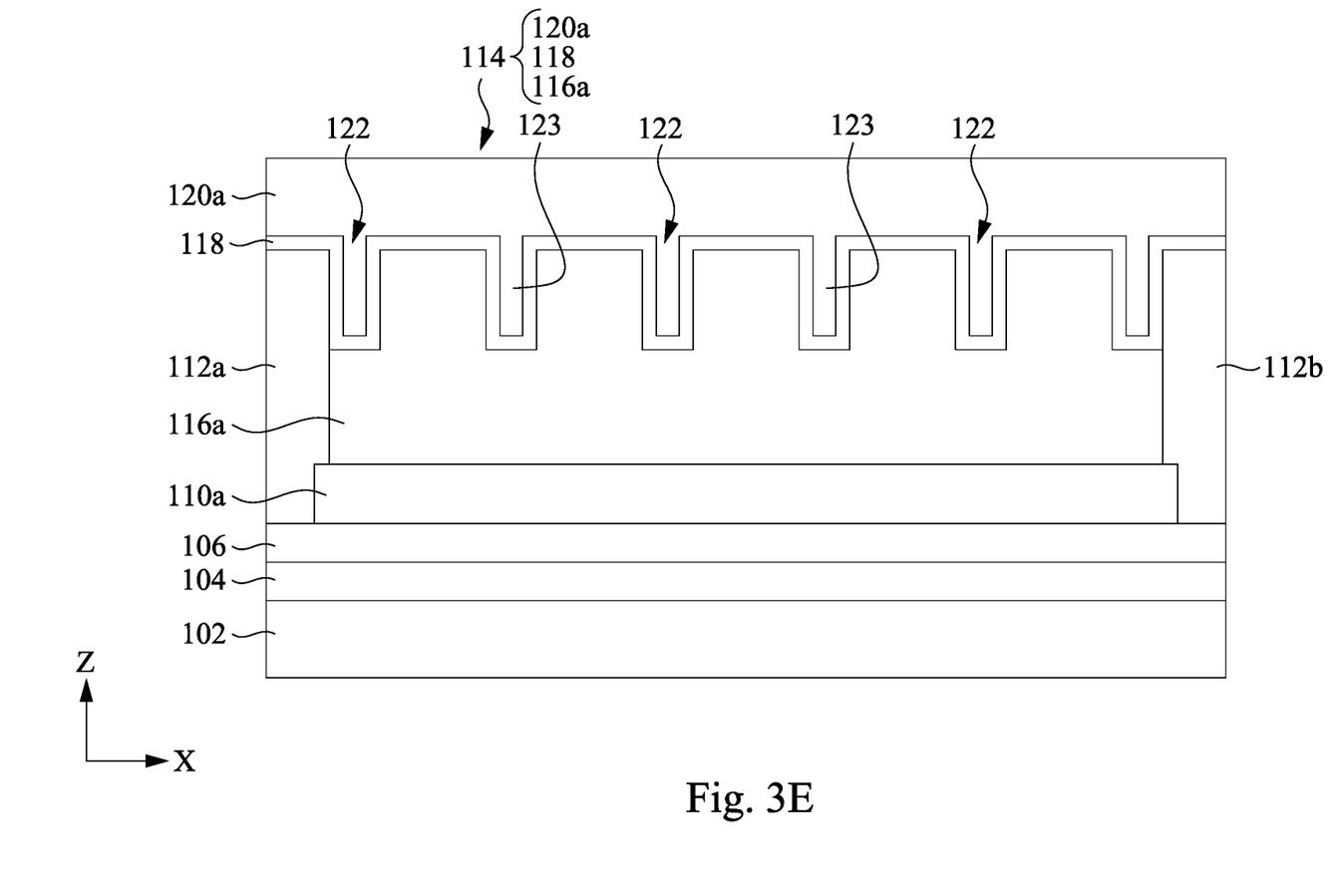

In the example shown in FIG. 3E, after operations 224 and 226, the top metal piece 120a is formed. The top metal piece 120a is formed on the intermediate layer 118 and fills the unfilled portion of the trenches 122. The top metal piece 120a has protrusions 123 that are located in the trenches and extend downwardly in the Z-direction.

The method 200 then proceeds to operation 228. At operation 228, the remaining sacrificial layer is removed. In one implementation, the remaining sacrificial layer is removed using the sacrificial release process. As explained above, the sacrificial layer is made of a material that is selectively removable in the subsequent sacrificial release process, and the remaining sacrificial layer corresponds to the area where the micromechanical arm is situated. In the meantime, the etch stop layer and the bottom metal layer are resistant to the etchant used in the sacrificial release process. Therefore, after the remaining sacrificial layer is removed, a cavity between the micromechanical arm and the etch stop layer is created, and the micromechanical arm is suspended.

The sacrificial release process is a process where a structure is formed on the sacrificial layer that is later removed to leave a gap between the structure and the etch stop layer under the sacrificial layer. In one example, the sacrificial layer is made of polysilicon, and the etch stop layer is made of silicon nitride ($Si_3N_4$). The sacrificial layer, which is made of polysilicon, is later etched using, for example, plasma etching. Sulfur hexafluoride ($SF_6$), for example, can be used as the etchant. During the plasma etching, a fraction of the sulfur hexafluoride breaks down into sulfur and fluorine, with the fluorine ions performing a chemical reaction with the sacrificial layer, which is made of polysilicon. It should be understood that the examples above are not intended to be limiting, and other materials, etchants, etching processes can be employed as needed.

In some implementations, a release aperture is fabricated using, for example, various lithography and etch techniques. The release aperture then provides access to the sacrificial layer for the etchant used in the sacrificial release process. The etchant starts etching through the release aperture and etches its way into the cavity. The size of the release aperture, along with other parameters such as the temperature, determines the etch rate of the sacrificial layer and can be designed accordingly. It should be understood that the above examples are not intended to be limiting. In some implementations, multiple release apertures can be used.

In the example shown in FIG. 3E and FIG. 1, after operation 228, the remaining sacrificial layer 110a (shown in FIG. 3E) is removed, and the cavity 108 (shown in FIG. 1) between the etch stop layer 106 and the micromechanical arm 114 is created.

Figure 4A:
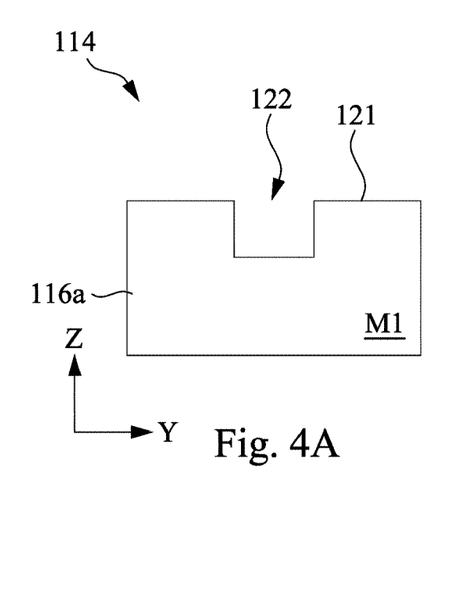
FIGS. 4A-4C are cross-sectional views, taken at one trench, of the micromechanical arm shown in FIG. 1 at various stages of fabrication in accordance with some embodiments.
Figure 4B:
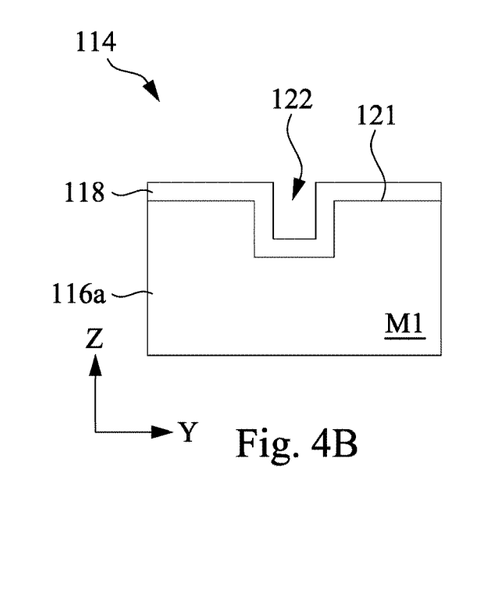
Figure 4C:
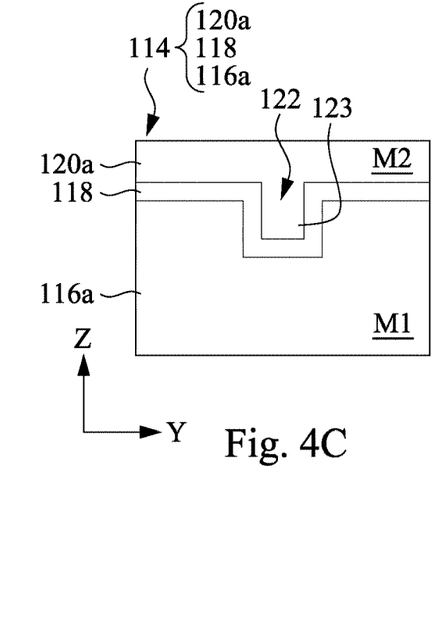

FIGS. 4A-4C are cross-sectional views, taken at one trench, of the micromechanical arm 114 shown in FIG. 1 at various stages of fabrication in accordance with some embodiments. It should be understood that other components (e.g., the substrate 102, and the like) of the MEMS structure 100 shown in FIG. 1 are not illustrated for ease of illustration. In the example shown in FIG. 4A, the bottom metal piece 116a (denoted as "M1" in FIG. 4A) is formed after the trenches 122 are selectively etched. The trench 122 shown in FIG. 4A extends downwardly from the top surface 121 in the Z-direction.

In the example shown in FIG. 4B, the intermediate layer 118 is formed on the top surface 121 and fills at least a portion of the trench 122. In the example shown in FIG. 4B, the intermediate layer 118 extends in the second horizontal direction (i.e., the Y-direction) and fills at least the bottom and sidewalls of the trench 122.

In the example shown in FIG. 4C, the top metal piece 120a (denoted as "M2" in FIG. 4C) has been formed on the intermediate layer 118. The top metal piece 120a fills the unfilled portion of the trench 122 and has a protrusion 123. The micromechanical arm 114, which includes the bottom metal piece 116a, the intermediate layer 118, and the top metal piece 120a, has been fabricated.

Figure 5:
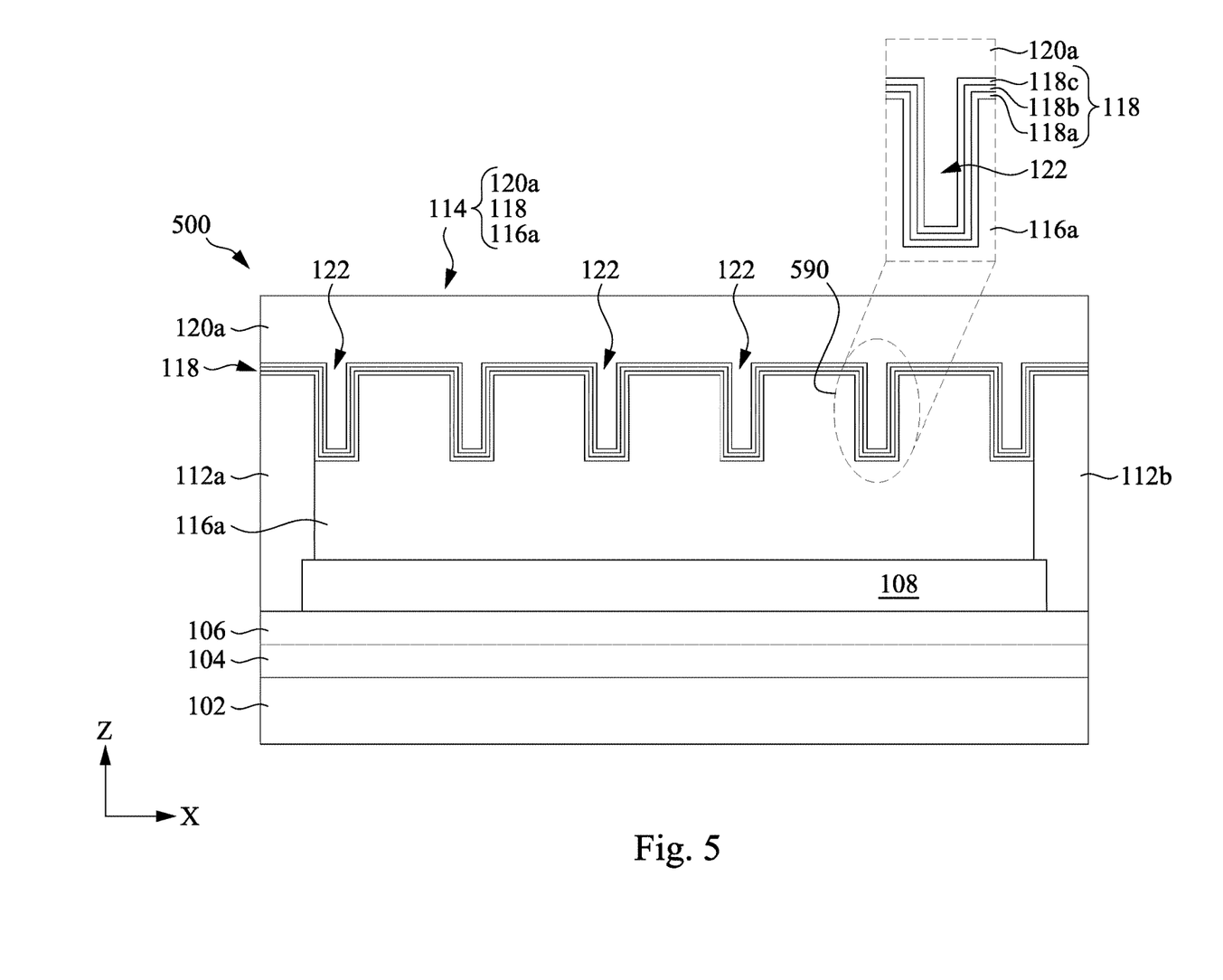
FIG. 5 is a cross-sectional diagram illustrating a MEMS structure having a mechanical arm in accordance with some embodiments.
Figure 6:
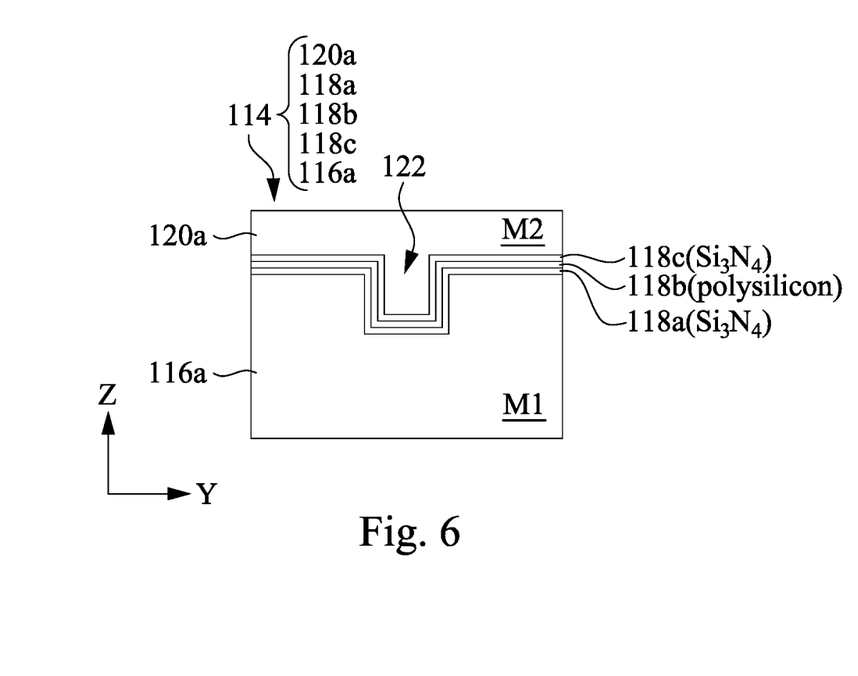
FIG. 6 is a cross-sectional view, taken at one trench, of the micromechanical arm shown in FIG. 5 in accordance with some embodiments.

FIG. 5 is a cross-sectional diagram illustrating a MEMS structure 500 having a mechanical arm 114 in accordance with some embodiments. FIG. 6 is a cross-sectional view, taken at one trench, of the micromechanical arm 114 shown in FIG. 5 in accordance with some embodiments. The MEMS structure 500 shown in FIG. 5 is the same as the MEMS structure 100 shown in FIG. 1, except that the intermediate layers 118 in the micromechanical arm 114 of the MEMS structure 500 have multiple layers of different materials instead of a single layer of one material. In the example shown in FIG. 5, the intermediate layers 118 includes a first intermediate layer 118a on the bottom metal piece 116a, a second intermediate layer 118b on the first intermediate layer 118a, and a third intermediate layer 118c on the second intermediate layer 118b. It should be understood that the number of intermediate layers is not intended to be limiting. In one example, the number of intermediate layers 118 is two. In another example, the number of intermediate layers 118 is four. In yet another example, the number of intermediate layers 118 is five. Other suitable numbers are within the scope of the disclosure.

The fabrication of the MEMS structure 500 is using a method identical to the method 200 shown in FIG. 2, except that multiple intermediate layers are deposited on the bottom metal layer at operation 222. In some implementations, the intermediate layers are formed one by one by deposition techniques such as CVD or PVD.

The intermediate layers 118a, 118b, and 118c are made of different materials that are softer than the bottom metal layer and the top metal layer. In one example shown in FIG. 6, the first intermediate layer 118a is made of silicon nitride, the second intermediate layer 118b is made of polysilicon, and the third intermediate layer 118c is made of silicon nitride. It should be understood that this example is not intended to be limiting, and other combinations of different materials of the intermediate layers 118a, 118b, and 118c can be employed.

Figure 7A:
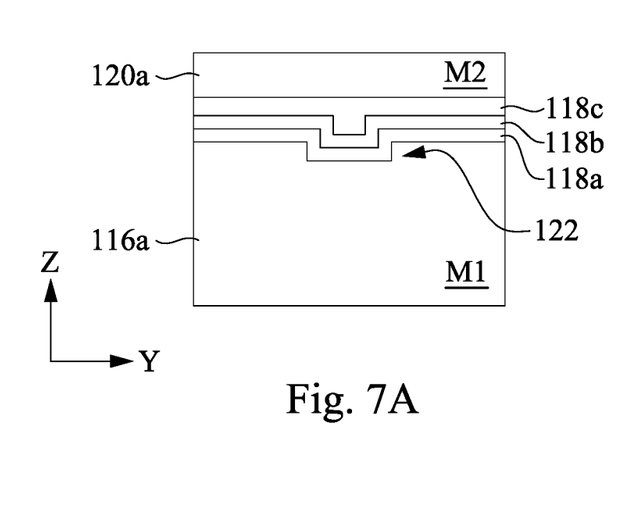
FIG. 7A is a cross-sectional view, taken at one trench, of a micromechanical arm in accordance with some embodiments.

FIG. 7A is a cross-sectional view, taken at one trench, of a micromechanical arm in accordance with some embodiments. In the example shown in FIG. 7A, the trench 122 is filled after forming the intermediate layers 118a, 118b, and 118c. This situation often occurs when the trench 122 is relatively shallow and the intermediate layers 118a, 118, and 118c are relatively thick.

Figure 7B:
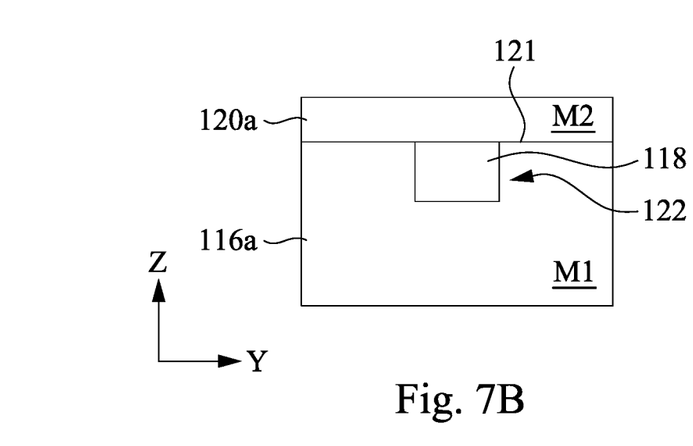
FIG. 7B is a cross-sectional view, taken at one trench, of a micromechanical arm in accordance with some embodiments.

FIG. 7B is a cross-sectional view, taken at one trench, of a micromechanical arm in accordance with some embodiments. In the example shown in FIG. 7B, the intermediate layer 118 fills the trench 122. The excessive intermediate layer 118 outside the trench 122 has been removed using a planarization process such as CMP. In other words, there are no intermediate layer 118 on the top surface 121 of the bottom metal piece 116a, and the intermediate layer 118 is enclosed by the bottom metal piece 116a and the top metal piece 120a. After the planarization process, the top metal piece 120a is formed on the bottom metal piece 116a by, for example, depositing a top metal layer followed by a planarization process such as CMP. In one example, the intermediate layer 118 is made of silicon nitride ($Si_3N_4$). In another example, the intermediate layer 118 is made of polysilicon. It should be understood that these examples are not intended to be limiting.

Figure 7C:
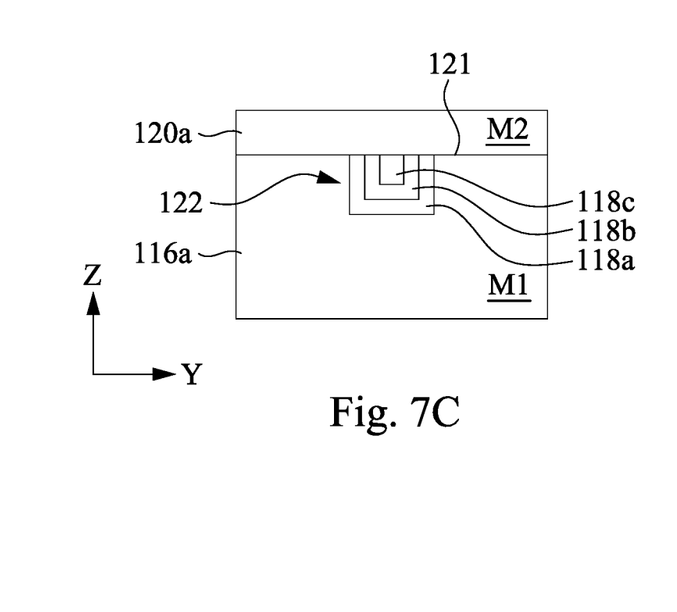
FIG. 7C is a cross-sectional view, taken at one trench, of a micromechanical arm in accordance with some embodiments.

FIG. 7C is a cross-sectional view, taken at one trench, of a micromechanical arm in accordance with some embodiments. In the example shown in FIG. 7C, the intermediate layers 118a, 118b, and 118c fill the trench 122. The excessive intermediate layers 118a, 118b, and 118c outside the trench 122 have been removed using a planarization process such as CMP. In other words, there are no intermediate layers 118a, 118b, or 118c on the top surface 121 of the bottom metal piece 116a, and the intermediate layer 118 is enclosed by the bottom metal piece 116a and the top metal piece 120a. After the planarization process, the top metal piece 120a is formed on the bottom metal piece 116a by, for example, depositing a top metal layer followed by a planarization process such as CMP. In one example, the intermediate layers 118a, 118b, and 118c are made of silicon nitride ($Si_3N_4$), polysilicon, and silicon nitride ($Si_3N_4$), respectively. In another example, the intermediate layers 118a, 118b, and 118c are made of polysilicon, silicon nitride ($Si_3N_4$), and polysilicon, respectively. It should be understood that these examples are not intended to be limiting.

Figure 7D:
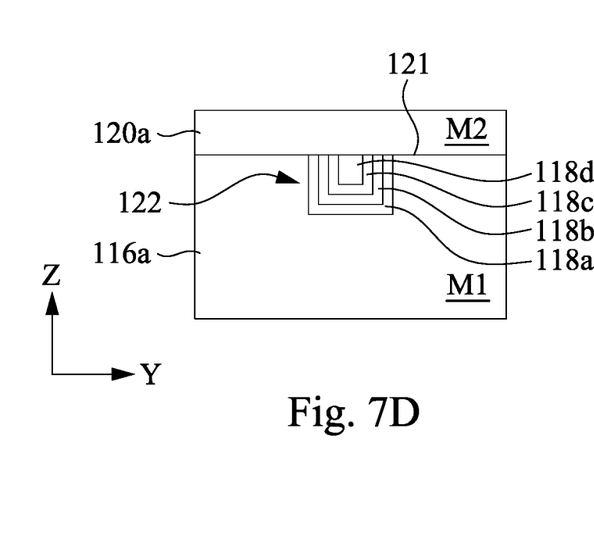
FIG. 7D is a cross-sectional view, taken at one trench, of a micromechanical arm in accordance with some embodiments.

FIG. 7D is a cross-sectional view, taken at one trench, of a micromechanical arm in accordance with some embodiments. In the example shown in FIG. 7D, the intermediate layers 118a, 118b, 118c, and 118d fill the trench 122. The excessive intermediate layers 118a, 118b, 118c, and 118d outside the trench 122 have been removed using a planarization process such as CMP. In other words, there is no intermediate layers 118a, 118b, 118c, or 118d on the top surface 121 of the bottom metal piece 116a, and the intermediate layer 118 is enclosed by the bottom metal piece 116a and the top metal piece 120a. After the planarization process, the top metal piece 120a is formed on the bottom metal piece 116a by, for example, depositing a top metal layer followed by a planarization process such as CMP. In one example, the intermediate layers 118a, 118b, 118c, and 118d are made of polysilicon, silicon nitride ($Si_3N_4$), polysilicon, and silicon nitride ($Si_3N_4$), respectively. In another example, the intermediate layers 118a, 118b, 118c, and 118d are made of silicon nitride ($Si_3N_4$), polysilicon, silicon nitride ($Si_3N_4$), and polysilicon, respectively. It should be understood that these examples are not intended to be limiting.

In accordance with some aspects of the disclosure, a micromechanical arm is provided. The micromechanical arm includes: a bottom metal piece having a plurality of trenches extending downwardly from a top surface of the bottom metal piece; an intermediate layer on the bottom metal piece and filling at least a portion of each of the plurality of trenches; and a top metal piece on the intermediate layer. The intermediate layer is made of a material that has a stiffness smaller than the bottom metal piece and the top metal piece.

In accordance with some aspects of the disclosure, a micro-electromechanical systems (MEMS) structure is provided. The MEMS structure includes: a substrate; an etch stop layer over the substrate; and a micromechanical arm over the etch stop layer with a cavity between the etch stop layer and the micromechanical arm in a vertical direction, comprising: a bottom metal piece having a plurality of trenches extending downwardly from a top surface of the bottom metal piece; a top metal piece; and an intermediate layer sandwiched between the bottom metal piece and the top metal piece and filling at least a portion of each of the plurality of trenches, wherein the intermediate layer is made of a material that has a stiffness smaller than the bottom metal piece and the top metal piece.

In accordance with some aspects of the disclosure, a method of fabricating a micro-electromechanical systems (MEMS) structure is provided. The method includes: providing a substrate; forming an etch stop layer over the substrate; forming a sacrificial layer on the etch stop layer; selectively etching the sacrificial layer to create a remaining sacrificial layer; forming a dielectric support layer; selectively etching the dielectric support layer to create an opening in the dielectric support layer; forming a bottom metal layer in the opening and on the remaining sacrificial layer; selectively etching the bottom metal layer to form a plurality of trenches extending downwardly from a top surface of the bottom metal layer; depositing an intermediate layer on the bottom metal layer such that the intermediate layer fills at least a portion of each of the plurality of trenches; forming a top metal piece on the intermediate layer; and removing the remaining sacrificial layer to create a cavity between the bottom metal layer and the etch stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A micromechanical arm comprising:
a bottom metal piece having a flat bottom surface extending in a first horizontal plane, a top surface over the flat bottom surface, and a plurality of trenches, the plurality of trenches being disposed in the bottom metal piece and extending downwardly from the top surface of the bottom metal piece;
an intermediate layer on the bottom metal piece and filling at least a portion of each of the plurality of trenches; and
a top metal piece on the intermediate layer; and
wherein the intermediate layer is made of a material that has a stiffness smaller than the bottom metal piece and the top metal piece.

2. The micromechanical arm of claim 1, wherein the intermediate layer is made of polycrystalline silicon.

3. The micromechanical arm of claim 1, wherein the intermediate layer is made of silicon nitride.

4. The micromechanical arm of claim 1, wherein the intermediate layer is made of a low-κ dielectric.

5. The micromechanical arm of claim 1, wherein the intermediate layer includes multiple intermediate layers.

6. The micromechanical arm of claim 1, wherein the intermediate layer fills a bottom and sidewalls of each of the plurality of trenches.

7. The micromechanical arm of claim 6, wherein the top metal piece has a plurality of protrusions extending downwardly and located in the plurality of trenches, respectively.

8. The micromechanical arm of claim 1, wherein the intermediate layer fills the plurality of trenches.

9. A micro-electromechanical systems (MEMS) structure comprising:
a substrate;
an etch stop layer over the substrate; and
a micromechanical arm over the etch stop layer with a cavity between the etch stop layer and the micromechanical arm in a vertical direction, comprising:
a bottom metal piece having a flat bottom surface extending in a first horizontal plane, a top surface over the flat bottom surface, and a plurality of trenches, the plurality of trenches being disposed in the bottom metal piece and extending downwardly from the top surface of the bottom metal piece;
a top metal piece; and
an intermediate layer sandwiched between the bottom metal piece and the top metal piece and filling at least a portion of each of the plurality of trenches, wherein the intermediate layer is made of a material that has a stiffness smaller than the bottom metal piece and the top metal piece.

10. The MEMS structure of claim 9, further comprising:
a dielectric layer on the substrate, wherein the etch stop layer is on the dielectric layer.

11. The MEMS structure of claim 9, further comprising:
at least one dielectric support structure on the etch stop layer and extending in the vertical direction, wherein the at least one dielectric support structure is in contact with an end of the micromechanical arm in a horizontal direction.

12. The MEMS structure of claim 9, wherein the intermediate layer is made of polycrystalline silicon.

13. The MEMS structure of claim 9, wherein the intermediate layer is made of silicon nitride.

14. The MEMS structure of claim 9, wherein the intermediate layer is made of a low-K dielectric.

15. The MEMS structure of claim 9, wherein the intermediate layer includes multiple intermediate layers.

16. A micromechanical arm comprising:
a bottom metal piece having a flat bottom surface extending in a first horizontal plane and a top surface over the first horizontal plane, wherein a plurality of trenches are disposed in the bottom metal piece and each of the plurality of trenches extends downwardly from the top surface;
an intermediate layer disposed conformally on the bottom metal piece and filling at least a portion of each of the plurality of trenches; and
a top metal piece disposed on the intermediate layer, and wherein the intermediate layer is made of a material that has a stiffness smaller than the bottom metal piece and the top metal piece.

17. The micromechanical arm of claim 16, wherein the intermediate layer is made of polycrystalline silicon.

18. The micromechanical arm of claim 16, wherein the intermediate layer is made of silicon nitride.

19. The micromechanical arm of claim 16, wherein the intermediate layer includes multiple intermediate layers.

20. The micromechanical arm of claim 16, wherein the intermediate layer fills the plurality of trenches.

* * * * *